United States Patent [19]

Hamano

[11] Patent Number: 4,794,446
[45] Date of Patent: Dec. 27, 1988

[54] ELECTRODE DEVICE AND A METHOD FOR MAKING THE SAME
[75] Inventor: Hisanori Hamano, Hyogo, Japan
[73] Assignee: Mitsubishi Denki Kabushiki Kaisha, Tokyo, Japan
[21] Appl. No.: 923,081
[22] Filed: Oct. 24, 1986
[30] Foreign Application Priority Data
Oct. 25, 1985 [JP] Japan .................. 60-240095
[51] Int. Cl.⁴ .................. H01L 23/28; H01L 23/48
[52] U.S. Cl. .................................. 357/74; 357/72
[58] Field of Search .................. 357/72, 68, 70; 174/52 FP

[56] References Cited
FOREIGN PATENT DOCUMENTS

| | | | |
|---|---|---|---|
| 0084554 | 5/1984 | Japan | 357/72 |
| 0161851 | 9/1984 | Japan | 357/72 |
| 0154051 | 9/1984 | Japan | 357/72 |
| 0161846 | 9/1984 | Japan | 357/72 |
| 0097653 | 5/1985 | Japan | 357/72 |
| 0254646 | 12/1985 | Japan | 357/72 |

Primary Examiner—Andrew J. James
Assistant Examiner—S. V. Clark
Attorney, Agent, or Firm—Lowe, Price, LeBlanc, Becker & Shur

[57] ABSTRACT

Portions adjacent to the tips of a plurality of leads taken out from at least one side of a package for protecting a semiconductor device are embedded in an integral insulating mold resin to maintain intervals between the adjacent leads and, each of the leads is bent at two portions so that the tip portion of each lead is positioned at the lower surface of said package.

13 Claims, 3 Drawing Sheets

ELECTRODE DEVICE AND A METHOD FOR MAKING THE SAME

BACKGROUND OF THE INVENTION

1. Field of the Invention

The present invention relates to an electronic device and a method for fabricating the same, and more particularly, it relates to an electronic device packaged in such a form that can be mounted with the substrate surface being contacted, and to a method for making the same.

2. Description of the Prior Art

A technology for mounting a device with a surface being in contact with a substrate surface is disclosed in an article entitled "How to Use Surface Mount Technology" published by Jerry Mullen et al., the staff of the Texas Instruments Information Publishing Center, 1984.

FIG. 1 is a schematic elevational view showing one example of a conventional electronic device of this kind and FIG. 2 is a perspective view showing the structure of leads of the electronic device of FIG. 1 viewed from the lower side 4.

As shown in FIGS. 1 and 2, a conventional electronic device is composed of a package 1 of a mold resin packing a circuit comprising small parts such as integrated circuits, resistor, capacitor and the like, and a lead 2 of a conductive metal. On one surface 4 of the package 1, concave portions 3 are provided for each of the leads. The surface 4 is to be close to a board such as a printed circuit board.

In a conventional electronic device, each of the leads 2 is bent at three portions and the tip of each lead 2 is fitted in the concave portion 3 provided on the surface 4, whereby the intervals between each of the leads 2 are maintained so as to prevent each of the leads 2 from contacting with the adjacent leads.

In the above described conventional structure, bending each of the leads 2 at three portions and fitting the tips in the respective concave portions 3 are troublesome and there arises a problem that many steps are required for processing.

SUMMARY OF THE INVENTION

It is a principal object of the present invention to provide an electronic device which is easily processed and in which the intervals between electrically conductive connecting leads are surely maintained.

Briefly stated, the present invention provides an electronic device in which a portion adjacent to the tip of each of the said leads taken out from a side of a package for protecting an electronic circuit is within insulating mold resin to maintain the intervals between each of the said leads and, each of the said leads are bent at two portions so that the tip portion of each of the leads is positioned on the lower surface of the package.

According to the present invention, since the device is structured such that a portion adjacent to the tip of each of the leads taken out from the side of the package is within insulating mold resin and each lead is bent at two portions, there is no need to provide concave portions on the package to fix the tip portion of each of the leads in the respective concave portions, so that the processing is easy and the intervals between each of the leads are surely maintained.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 3:
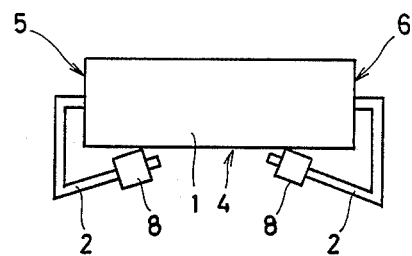
FIG. 3 is a schematic elevational view showing the electronic device according to one embodiment of the present invention.
Figure 4A:
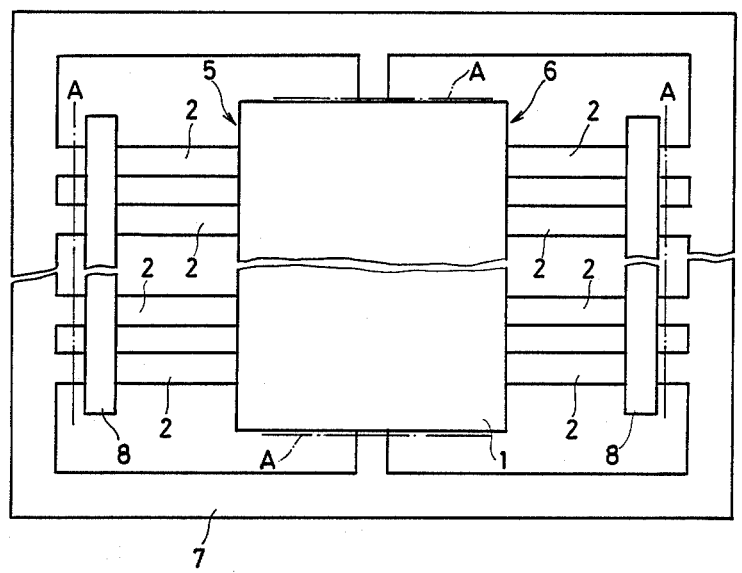
FIGS. 4A to 4C illustrate a method for making the electronic device according to one embodiment of the present invention.
Figure 4B:
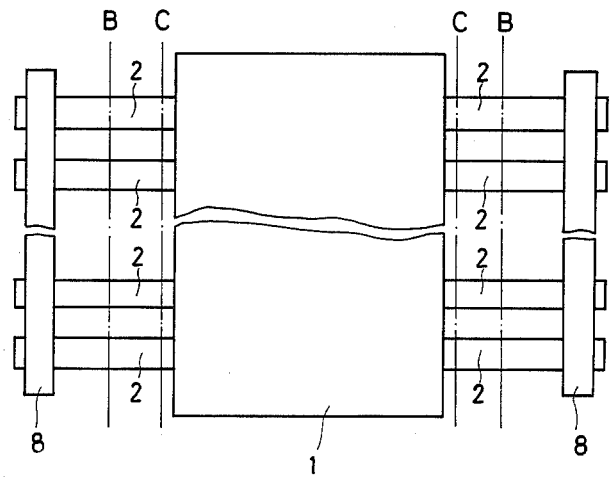
Figure 4C:
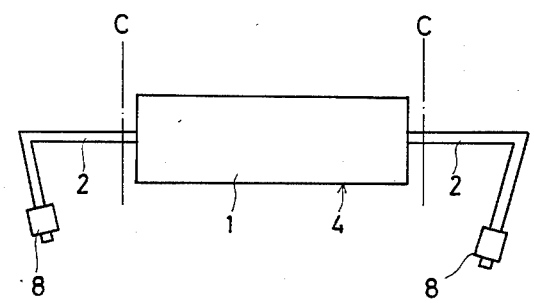

FIG. 3 is a schematic elevational view showing an electronic device according to one embodiment of the present invention and FIGS. 4A to 4C are diagrams showing a processing method of the leads in manufacturing the electronic device according to one embodiment of the present invention.

Figure 1:
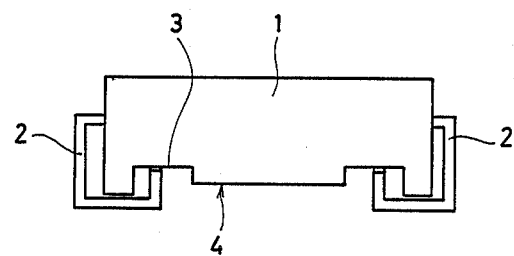
FIG. 1 is a schematic elevational view showing one example of a conventional electronic device.
Figure 2:
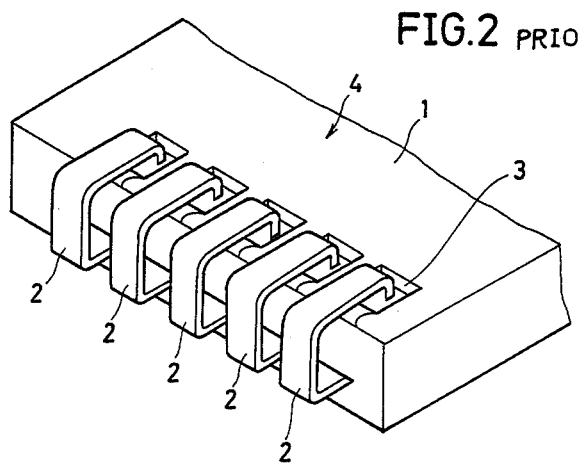
FIG. 2 is a perspective view showing the structure of leads of the electronic device shown in FIG. 1.

In FIGS. 3, 4A to 4C, the same or the corresponding portions to FIGS. 1 and 2 are designated by the same reference numerals.

Referring to FIG. 3, the electronic device according to the present embodiment comprises the electrically conductive connecting leads 2 taken out from two sides 5 and 6 of the package 1. The conductive connecting lead 2 is bent approximately at a right angle at a portion adjacent to the sides 5 and 6 of the package 1 and is bent at an acute angle at a lower portion of the package 1 toward the lower surface 4 of the package 1. A portion adjacent to the tip of each of the leads 2 is within insulating mold resin 8.

Referring to FIGS. 4A to 4C, a method for making the electronic device according to one embodiment of the present invention shown in FIG. 3 will be hereinafter described in detail.

At the step shown in FIG. 4A, an electronic circuit formed of an integrated circuit, resistor, a capacitor and the like of a predetermined electronic apparatus is packed in a package 1 and a plurality of leads 2 to be input and output lines of the electronic circuit are taken out from the sides 5 and 6 of the package 1. Before cutting the lead 2 from the frame portion 7 of the the lead frame, an insulating mold resin 8 is formed to enclose the portion adjacent to the tip of each of the leads 2. It goes without saying that the mold resin 8 may be formed simultaneously with the formation of the package 1.

After the formation of the mold resin 8, the lead 2 is cut at a portion shown by a dotted line A in FIG. 4A so as to be separated from the frame portion 7. Even if each of the leads 2 is cut off from the frame portion 7, the interval between each of the leads 2 is maintained by the mold resin 8.

Then, each of the leads 2 is bent at a portion shown by the dotted line B in FIG. 4B at an acute angle toward the surface 4 which is to be in contact with the substrate surface, as shown in FIG. 4C. Then the lead 2 is bent at a portion shown by the dotted line C in FIGS. 4B and 4C, whereby the tip portion of each of the leads 2 or the mold resin 8 are fixed in contact with the lower surface 4 of the package 1 as shown in FIG. 3.

In the above described processing method of the leads, a portion adjacent to the tip of each of the leads 2 is within in an integral mold resin 8, so that the intervals between any adjacent leads 2 do not become uneven, maintaining the electric insulation between the adjacent leads 2. In addition, since each of the leads is bent at only two portions and there is no need to form the tip portion of each lead 2 in a concave portion, processing is easy and an electronic device can be manufactured at a low cost.

Although in the above described embodiment leads are taken out from two opposite sides, the present invention can be applied to a device in which the leads are taken out from one side or from four sides.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electronic device, comprising:
a package for protecting an electronic circuit of said electronic device, said electronic circuit to be connected to external circuitry, said package comprising:
a plurality of electrically conductive connecting leads taken out from at least one side of said package, for electrical connection to said electronic circuit, wherein
each of said electrically conductive connecting leads is bent approximately at a right angle at a portion adjacent to the side of said package and further bent at an acute angle below said package toward the lower surface of said package, and
the tip of each of said electrically conductive connecting leads is maintained spaced apart from said package.

2. An electronic device according to claim 1, wherein said electrically conductive connecting leads are taken out from all sides of said package.

3. An electronic device, comprising:
a package for protecting an electronic circuit of said electronic device, said electronic circuit to be connected to external circuitry, said package comprising:
a plurality of electrically conductive connecting leads taken out from at least one side of said package, for electrical connection of said electronic circuit to said external circuitry, wherein
each of said electrically conductive connecting leads is bent approximately at a right angle at a portion adjacent a side of said package and further bent at an acute angle below said package toward the lower surface of said package, and
a portion adjacent the tip of each of said electrically conductive connecting leads is embedded within a mold resin to maintain a displacement of said electrically conductive connecting leads from said package and from each other.

4. An electronic device, comprising:
a package for protecting an electronic circuit of said electronic device, said electronic circuit to be connected to external circuitry, said package comprising:
a plurality of electrically conductive connecting leads taken out from at least one side of said package, for electrical connection of said electronic circuit to said external circuitry, wherein
each of said electrically conductive connecting leads is bent in first and second straight line segments, said first segment being bent approximately at a right angle at a portion adjacent a side of said package and said second segment being bent at an acute angle below said package toward the lower surface of said package.

5. An electronic device, comprising:
a package for protecting an electronic circuit of said electronic device, said electronic circuit to be connected to external circuitry, said package comprising:
a plurality of electrically conductive connecting leads taken out from at least one side of said package, for electrical connection of said electronic circuit to said external circuitry, wherein
each of said electrically conductive connecting leads is bent in first and second straight line segments, said first segment being bent approximately at a right angle at a portion adjacent a side of said package and said second segment being bent at an acute angle below said package toward a lower surface of said package, and
a portion adjacent the tip of each of said electrically conductive connecting leads is embedded within a mold resin to maintain a uniform displacement of said electrically conductive connecting leads from said package and from each other.

6. An electronic device as recited in claim 5, wherein a single mold resin contains each of said electrically conductive connecting leads embedded therein.

7. An electronic device as recited in claim 5, wherein said lower surface of said package is free of recessed portions for receiving said connecting leads.

8. An electronic device as recited in claim 5, wherein said lower surface of said package comprises a substantially planar surface including a portion in contact with said mold resin containing said connecting leads embedded therein.

9. An electronic device as recited in claim 3, wherein said lower surface of said package is free of recessed portions for receiving said connecting leads.

10. An electronic device as recited in claim 3, wherein said lower surface of said package comprises a substantially planar surface including a portion in contact with said mold resin containing said connecting leads embedded therein.

11. An electronic device as recited in claim 1, wherein said lower surface of said package is free of recessed portions for receiving said connecting leads.

12. An electronic device as recited in claim 1, wherein said lower surface of said package comprises a substantially planar surface including a portion in contact with said mold resin containing said connecting leads embedded therein.

13. An electronic device as recited in claim 1, wherein said right angle bend of each of said leads is externally removed from said side of said package.

* * * * *

UNITED STATES PATENT AND TRADEMARK OFFICE
CERTIFICATE OF CORRECTION

PATENT NO. : 4,794,446

DATED : December 27, 1988

INVENTOR(S) : Hisanori HAMANO

It is certified that error appears in the above-identified patent and that said Letters Patent is hereby corrected as shown below:

On the title page, and again at the top of column 1, please correct the title to read as follows:

ELECTRONIC DEVICE AND A METHOD FOR MAKING THE SAME

Signed and Sealed this

Fourth Day of April, 1989

Attest:

DONALD J. QUIGG

Attesting Officer

Commissioner of Patents and Trademarks